US009673287B2

(12) United States Patent
Burke

(10) Patent No.: US 9,673,287 B2
(45) Date of Patent: Jun. 6, 2017

(54) RELIABLE AND ROBUST ELECTRICAL CONTACT

(71) Applicant: Infineon Technologies Americas Corp., El Segundo, CA (US)

(72) Inventor: Hugo Burke, Llantrisant (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/944,048

(22) Filed: Nov. 17, 2015

(65) Prior Publication Data

US 2016/0172454 A1 Jun. 16, 2016

Related U.S. Application Data

(60) Provisional application No. 62/092,155, filed on Dec. 15, 2014.

(51) Int. Cl.
| | | |
|---|---|---|
| H01L 23/00 | (2006.01) | |
| H01L 29/417 | (2006.01) | |
| H01L 29/205 | (2006.01) | |
| H01L 23/48 | (2006.01) | |
| H01L 29/78 | (2006.01) | |
| H01L 29/45 | (2006.01) | |
| H01L 29/66 | (2006.01) | |

(52) U.S. Cl.
CPC ........ *H01L 29/41741* (2013.01); *H01L 23/48* (2013.01); *H01L 24/00* (2013.01); *H01L 29/205* (2013.01); *H01L 29/452* (2013.01); *H01L 29/456* (2013.01); *H01L 29/66734* (2013.01); *H01L 29/7813* (2013.01); *H01L 2224/05027* (2013.01); *H01L 2224/05624* (2013.01); *H01L 2224/13147* (2013.01); *H01L 2225/06524* (2013.01); *H01L 2924/01074* (2013.01)

(58) Field of Classification Search
CPC . H01L 2924/01074; H01L 2224/13147; H01L 2224/05624; H01L 2225/06524; H01L 23/48; H01L 2224/05027
See application file for complete search history.

(56) References Cited

U.S. PATENT DOCUMENTS

| | | | | |
|---|---|---|---|---|
| 6,423,571 | B2 * | 7/2002 | Ogino | 257/E23.067 |
| 6,534,723 | B1 * | 3/2003 | Asai | H01L 23/49811 174/255 |
| 6,690,580 | B1 * | 2/2004 | Goldberg | H01L 21/76802 174/256 |
| 2011/0290547 | A1 * | 12/2011 | Chen | G06F 3/044 174/261 |
| 2013/0000847 | A1 * | 1/2013 | Tetsuka | C23C 16/45563 156/345.33 |
| 2013/0062779 | A1 * | 3/2013 | Zimmer | H01L 24/05 257/774 |
| 2014/0124946 | A1 * | 5/2014 | Farooq | H01L 21/76898 257/774 |

* cited by examiner

*Primary Examiner* — Ngan Ngo
(74) *Attorney, Agent, or Firm* — Murphy, Bilak & Homiller, PLLC

(57) ABSTRACT

In one implementation, a reliable and robust electrical contact includes a contact pad patterned from a first metal layer situated over a surface of an active die, and multiple dielectric islands situated over the contact pad. The dielectric islands are spaced apart from one another by respective segments of a second metal layer formed between and over the dielectric islands. The contact pad, the dielectric islands, and the second metal layer provide the reliable and robust electrical contact.

20 Claims, 9 Drawing Sheets

RELIABLE AND ROBUST ELECTRICAL CONTACT

The present application claims the benefit of and priority to a provisional application entitled "Reliable and Robust Wire Bonding Over Gate Bus on a DLM Structure," Ser. No. 62/092,155 filed on Dec. 15, 2014. The disclosure in this provisional application is hereby incorporated fully by reference into the present application.

BACKGROUND

Background Art

Vertical power transistors, such as group IV based trench type field-effect transistors (trench FETs), are used in a variety of applications. For example, silicon based trench metal-oxide-semiconductor FETs (trench MOSFETs) may be used to implement a power converter, such as a synchronous rectifier, or a direct current (DC) to DC power converter.

Double layer metal (DLM) trench MOSFET structures utilize two metal layers that at least partially overlap to provide source and gate contacts, thereby increasing the active area of the device without increasing device size. In a conventional DLM structure, a contiguous intermetal dielectric is typically interposed between the overlapping metal layers and serves to isolate the source and gate contacts from one another. However, stresses due to, for example, attachment of wire bond to the source contact, can result in cracks being propagated through portions of the contiguous intermetal dielectric layer. Such cracks in the intermetal dielectric may undesirably enable a short to develop between the source and gate contacts.

SUMMARY

The present disclosure is directed to a reliable and robust electrical contact, substantially as shown in and/or described in connection with at least one of the figures, and as set forth in the claims.

DETAILED DESCRIPTION

Figure 1:
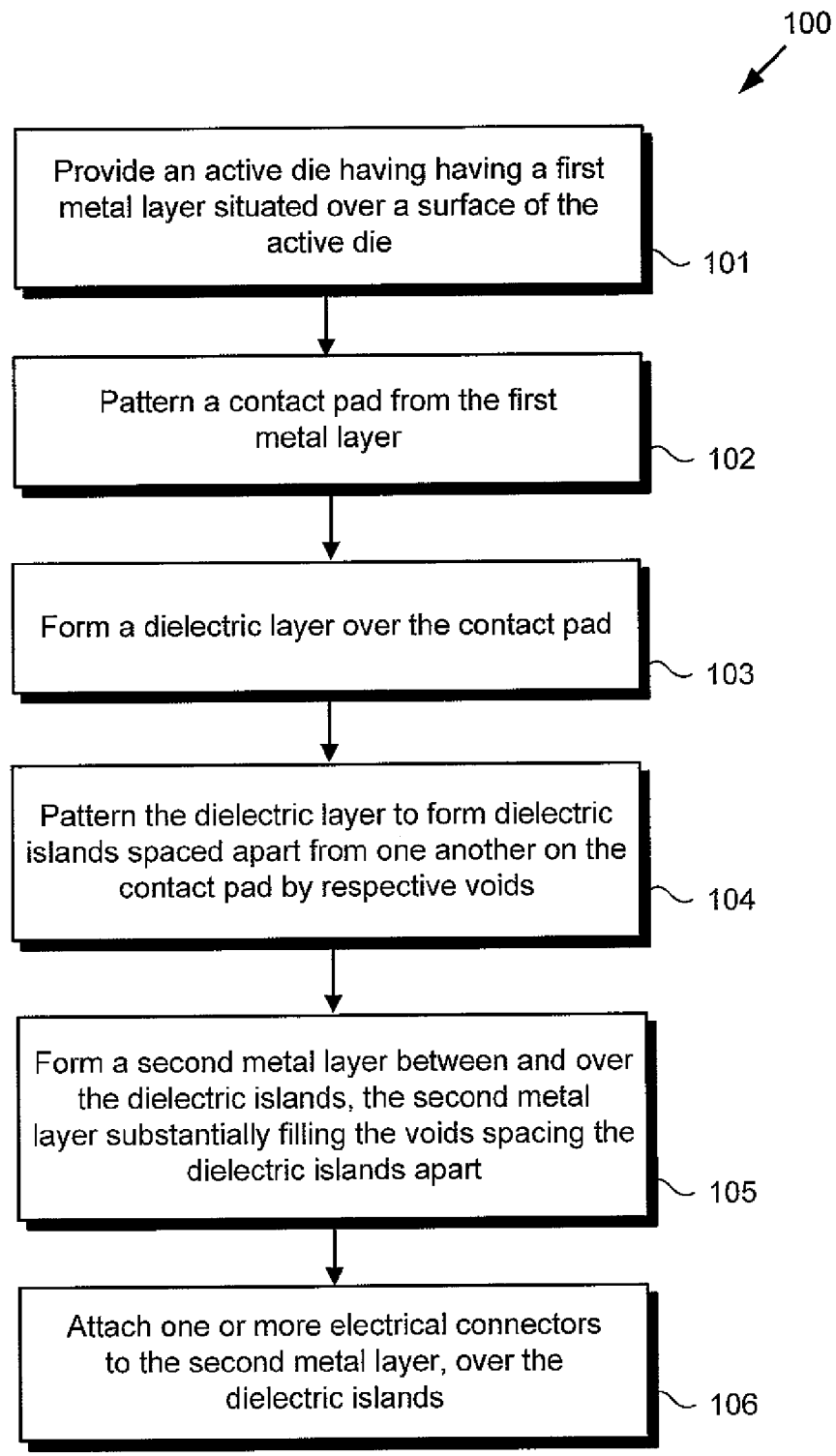
FIG. 1 is flowchart presenting an exemplary method for fabricating a reliable and robust electrical contact, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, vertical power transistors, such as group IV based trench type field-effect transistors (trench FETs), are used in a variety of applications. For example, silicon based trench metal-oxide-semiconductor FETs (trench MOSFETs) may be used to implement a power converter, such as a synchronous rectifier, or a direct current (DC) to DC power converter.

As further stated above, double layer metal (DLM) trench MOSFET structures utilize two metal layers that at least partially overlap to provide source and gate contacts, thereby increasing the active area of the device without increasing device size. In a conventional DLM structure, a contiguous intermetal dielectric is typically interposed between the overlapping metal layers, and serves to isolate the source and gate contacts from one another. However, stresses due for example to attachment of wire bond to the source contact, can result in cracks being propagated through portions of the contiguous intermetal dielectric layer. Such cracks in the intermetal dielectric may undesirably enable a short to develop between the source and gate contacts.

The present application discloses a reliable and robust electrical contact designed to avoid the disadvantages associated with conventional DLM structures. According to the exemplary implementations described in the present application, such an electrical contact includes a contact pad patterned from a first metal layer situated over a surface of an active die. Multiple dielectric islands are situated over the contact pad, the dielectric islands being spaced apart from one another by respective segments of a second metal layer formed between and over the dielectric islands. The contact pad patterned from the first metal layer, the dielectric islands, and the second metal layer provide the reliable and robust electrical contact.

FIG. 1 shows flowchart 100 presenting an exemplary method for fabricating a reliable and robust electrical contact. The exemplary method described by flowchart 100 is performed on a portion of an active die, which may be implemented so as to provide a power transistor, such as a group IV or group III-V transistor, or an integrated circuit (IC).

Figure 2A:
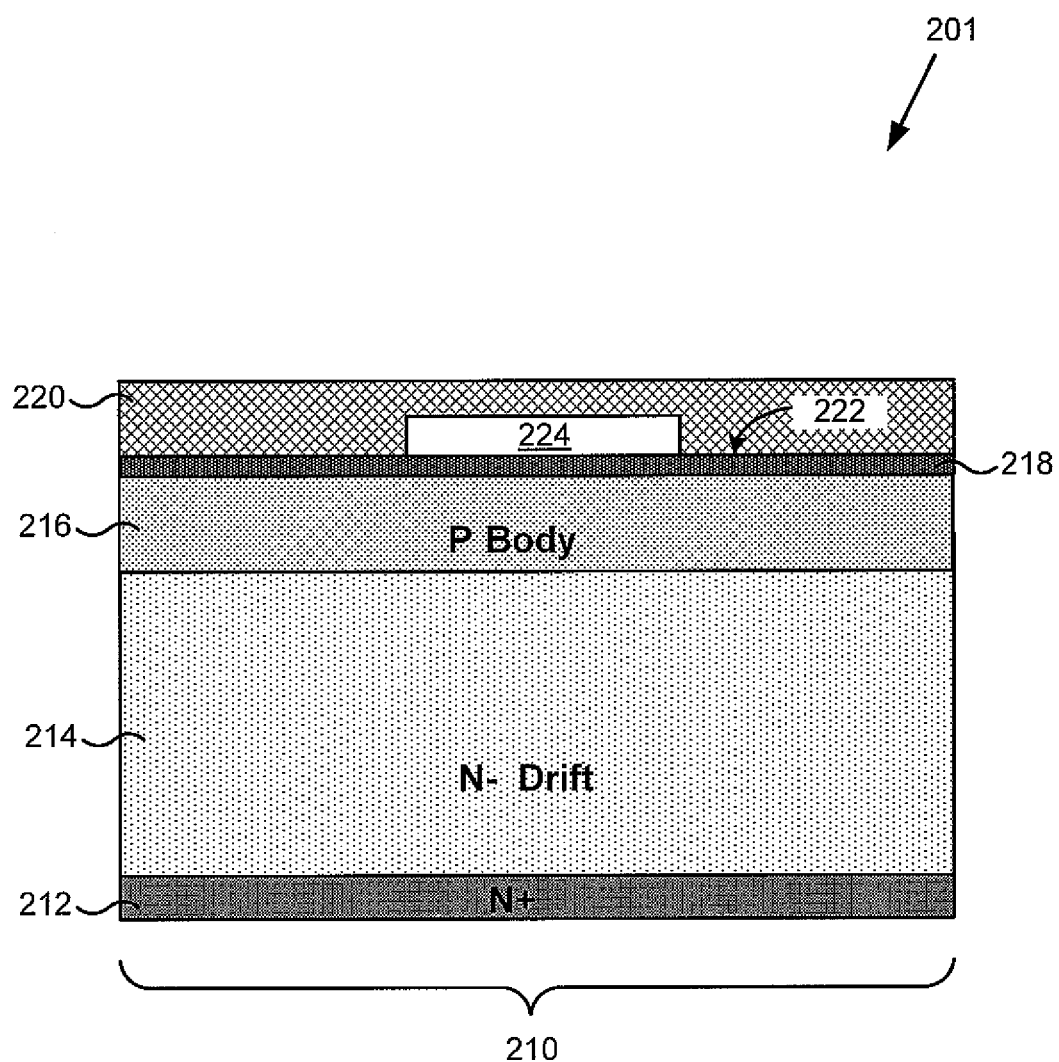
FIG. 2A shows a cross-sectional view illustrating a result of performing an initial action according to the exemplary flowchart of FIG. 1, according to one implementation.
Figure 2B:
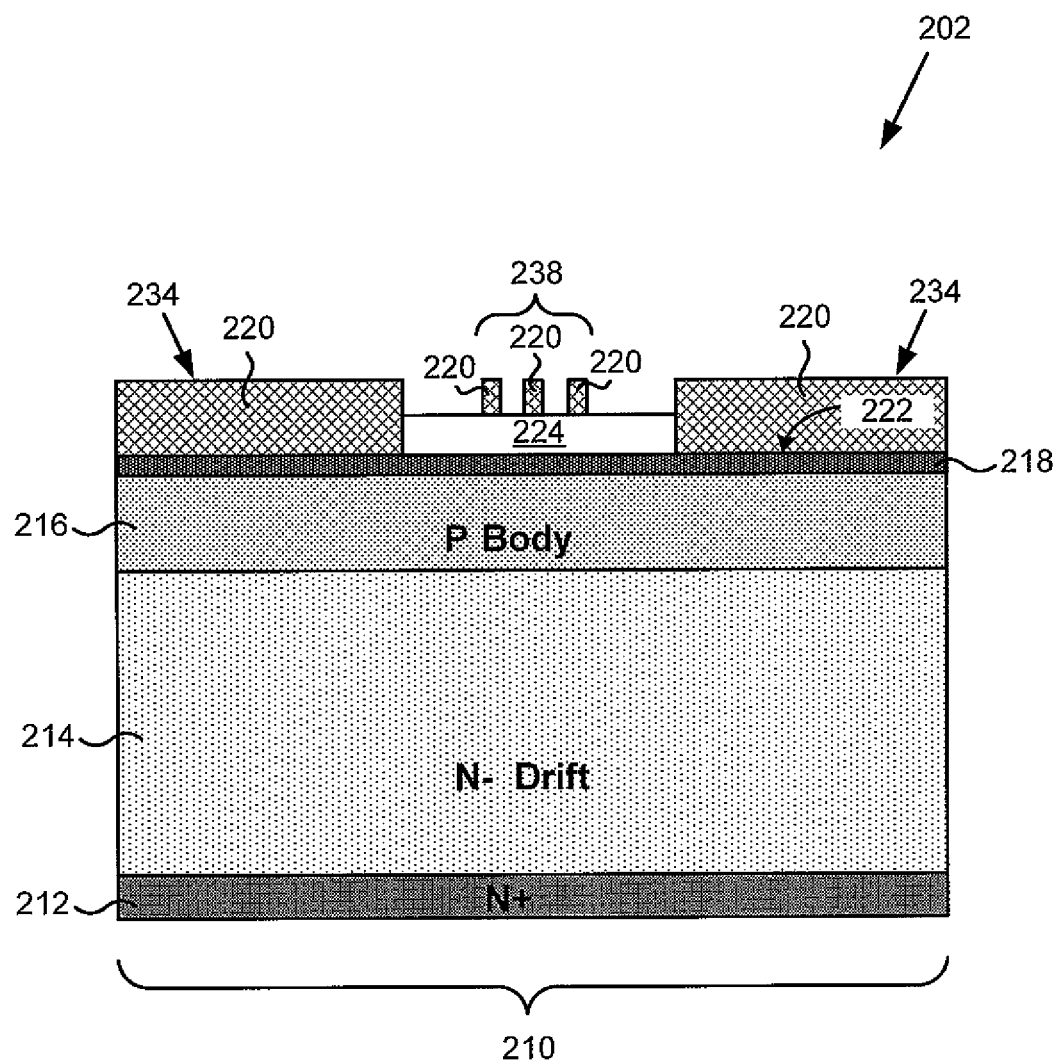
FIG. 2B shows a cross-sectional view illustrating a result of performing a subsequent action according to the exemplary flowchart of FIG. 1, according to one implementation.
Figure 2C:
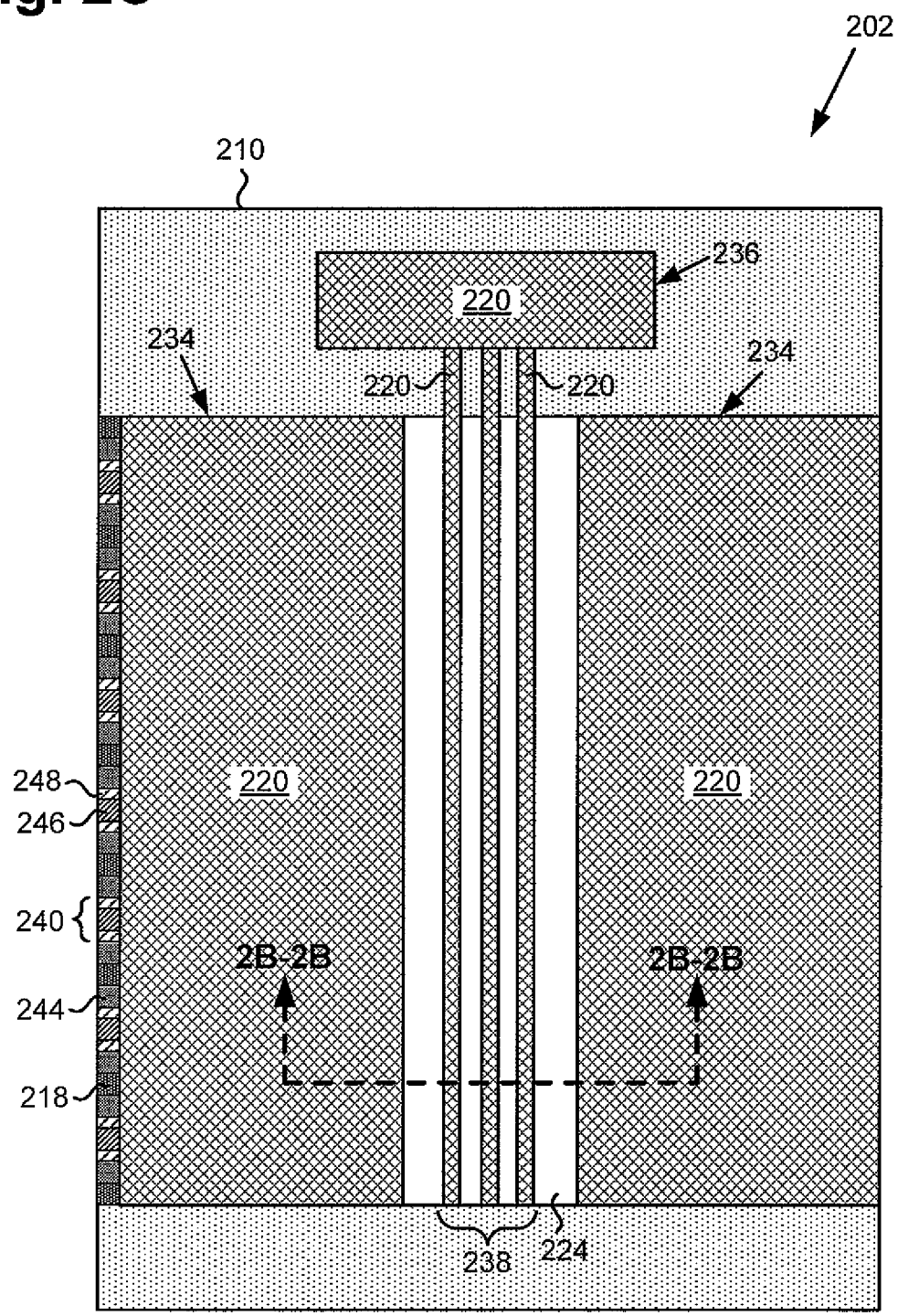
FIG. 2C shows a top view of the structure shown in cross-section in FIG. 2B, according to one implementation.
Figure 2D:
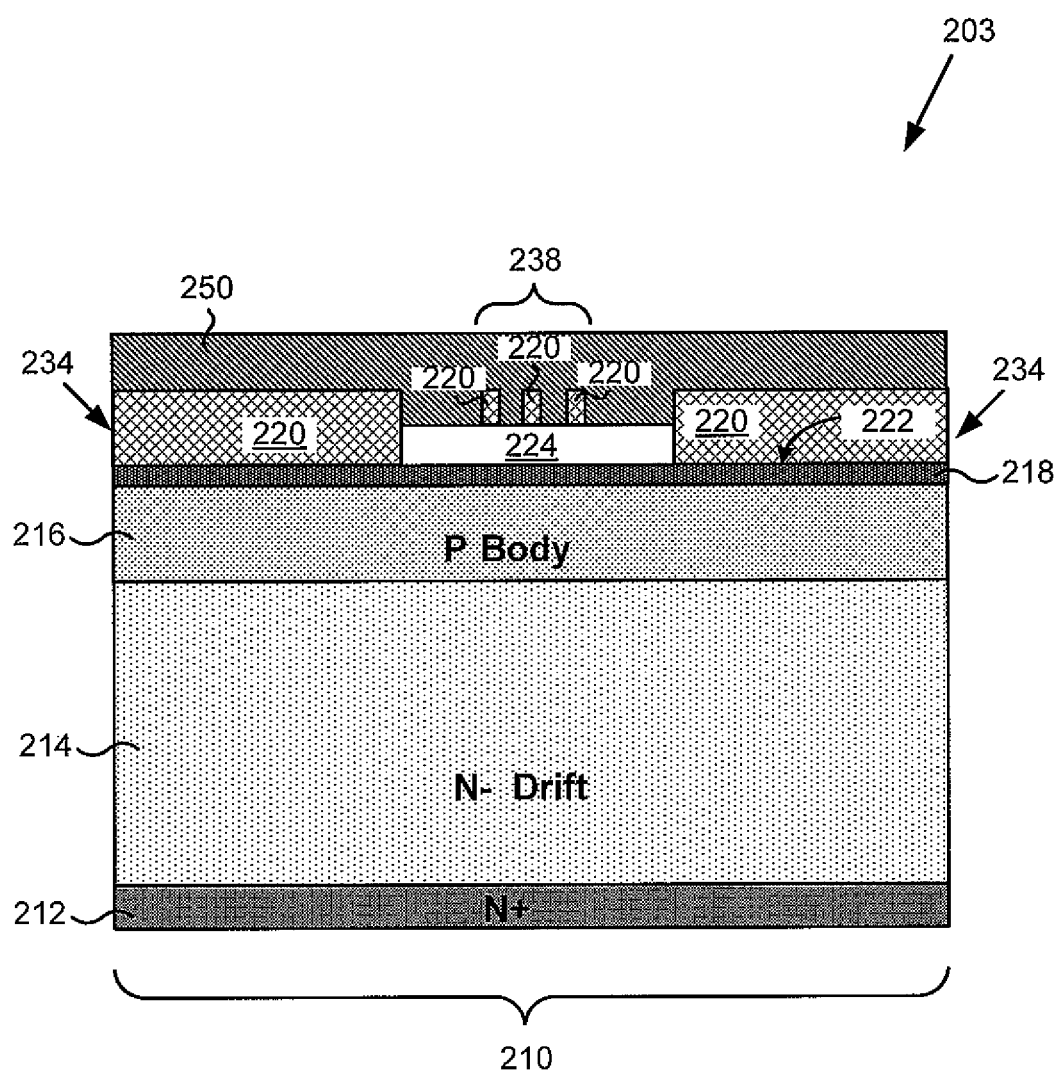
FIG. 2D shows a cross-sectional view illustrating a result of performing a subsequent action according to the exemplary flowchart of FIG. 1, according to one implementation.

With respect to FIGS. 2A-2H, structures 201-206 shown in those figures illustrate the result of performing the method of flowchart 200, according to one implementation. For example, structure 201, shown in cross-section in FIG. 2A, represents active die 210 having first metal layer 220 situated over surface 222 (action 101). Structure 202, shown in cross-section in FIG. 2B and in top view in FIG. 2C, shows contact pads 234 patterned from first metal layer 220 (action 102). Structure 203, shown in cross-section in FIG. 2D, shows dielectric layer 250 formed over contact pads 234 (action 103), and so forth.

Referring to flowchart 100, in FIG. 1, in combination with FIG. 2A, flowchart 100 begins with providing active die 210 having first metal layer 220 situated over surface 222 of active die 210 (action 101). As shown in the cross-sectional view presented in FIG. 2A, active die 210 includes highly doped N type drain 212 at a bottom surface of active die 210, and N type drift region 214 situated over highly doped N type drain 212. In addition, active die 210 includes P type body region 216 situated over N type drift region 214, and highly doped P type body diffusion 218 overlying P type body region 216. Also shown in FIG. 2A are dielectric segment 224 and first metal layer 220, both of which are shown to be situated over surface 222 of active die 210.

Dielectric segment 224 may be formed using any material and any technique typically employed in the art. For example, dielectric segment 224 may be patterned from a dielectric layer, such as a passivation layer, formed over surface 222 of active die 210. Dielectric segment 224 may be formed of silicon nitride ($Si_3N_4$) or silicon dioxide ($SiO_2$), for example.

First metal layer 220 may be an aluminum (Al) layer, or may be formed of an aluminum alloy, such as aluminum-silicon (Al—Si) or aluminum-silicon-copper (Al—Si—Cu), for example. In some implementations, first metal layer 220 may be a relatively thin metal layer, such as a metal layer having a thickness in a range from approximately one micrometer to approximately two micrometers (0.5 μm-2.5 μm), for example. However, in other implementations, metal layer 220 may have a thickness of up to approximately 10.0 μm, or more.

Moving to FIGS. 2B and 2C, with continued reference to flowchart 100, in FIG. 1, flowchart 100 continues with patterning a contact pad from first metal layer 220 (action 102). FIG. 2B shows a cross-sectional view of structure 202 including contact pads 234 patterned from first metal layer 220, while FIG. 2C shows a top view of structure 202, as well as perspective lines 2B-2B corresponding to the cross-section shown in FIG. 2B. As is apparent from FIG. 2C, the cross-section shown by FIG. 2B is viewed from within highly doped P type source diffusion 218, and is parallel to highly doped N type source regions 244, as well as to gate trenches 240 including respective gate electrodes 246 and gate dielectric 248. Also shown in FIG. 2C are gate pad 236, and gate buses 238 situated over dielectric segment 224 and oriented substantially perpendicular to the cross-sectional view shown in FIG. 2B.

It is noted that the features identified by the same reference numbers in FIGS. 2A-2H correspond respectively to one another and may share any of the characteristics attributed to them by reference to any individual figure of the present application. In other words, active die 210 including gate trenches 240, highly doped N type source regions 244, and highly doped P type body diffusions 218, in FIG. 2C, corresponds to active die 210 including highly doped N type drain 212, N type drift region 214, P type body region 216, and highly doped P type body diffusions 218, in FIGS. 2A and 2B, and may share any of the characteristics attributed to that corresponding feature in the present application.

In addition, contact pads 234, gate buses 238, and dielectric segment 224, in FIG. 2C, correspond respectively to contact pads 234 and gate buses 238, in FIG. 2B, and to dielectric segment 224 in FIGS. 2A and 2B. As described above, dielectric segment 224 may be patterned from a dielectric layer, such as a passivation layer, formed over surface 222 of active die 210. Thus, it is further noted that, although not visible from the perspectives shown by FIG. 2A, 2B, or 2C, dielectric segment 224 is patterned so as to be situated over gate trenches 240 in order to electrically isolate gate electrodes 246 from first metal layer 222.

Active die 210 may be implemented using a group IV based substrate, such as a silicon (Si) substrate or a silicon carbide (SiC) substrate, for example. Moreover, in some implementations, active die 210 may include N type drift region 214 and P type body region 216 formed in an epitaxial silicon layer. Formation of such an epitaxial silicon layer may be performed by any suitable method, as known in the art, such as chemical vapor deposition (CVD) or molecular beam epitaxy (MBE), for example. More generally, however, N type drift region 214 and P type body region 216 may be formed in any suitable elemental or compound semiconductor layer included in active die 210.

Thus, in other implementations, N type drift region 214 and P type body region 216 need not be formed through epitaxial growth, and/or need not be formed of silicon. For example, in one alternative implementation, N type drift region 214 and P type body region 216 can be formed in a float zone silicon layer of active die 210. In other implementations, N type drift region 214 and P type body region 216 can be formed in either a strained or unstrained germanium layer formed as part of active die 210.

P type body region 216 and highly doped P type body diffusion 218 may be formed by implantation and thermal diffusion. For example, boron (B) dopants may be implanted into active die 210 and diffused to form P type body region 216 and highly doped P type body diffusion 218. Referring to FIG. 2C, highly doped N type source regions 244 may be analogously formed by implantation and thermal diffusion of a suitable N type dopant in active die 210. Such a suitable N type dopant may include arsenic (As) or phosphorous (P), for example.

Gate electrodes 246 may be formed using any electrically conductive material typically utilized in the art. For example, gate electrodes 246 may be formed of doped polysilicon or metal. Gate dielectric 248 insulating gate electrodes 340 from highly doped N type source regions 244 may be formed using any material and any technique typically employed in the art. For example, gate dielectric 248 may be formed of $SiO_2$, and may be deposited or thermally grown to produce gate dielectric 248.

It is noted that although the implementation shown in FIGS. 2A-2C, as well as subsequent FIGS. 2D-2H, depict active die 210 as providing an n-channel vertical power FET having N type drain 212, N type drift region 214, P type body region 216, and N type source regions 244, that representation is merely exemplary. In other implementations, the described polarities can be reversed such that active die 210 may provide a p-channel device having a P type drain, a P type drift region, an N type body region, and P type source regions.

It is further noted that in the interests of ease and conciseness of description, the present inventive principles will in some instances be described by reference to specific implementations of a silicon based vertical power FET. However, it is emphasized that such implementations are merely exemplary, and the inventive principles disclosed herein are broadly applicable for use with a wide variety of active dies. For example, an active die corresponding in general to active die 210 may be utilized to implement an IC, or to implement another group IV material based, or group III-V semiconductor based, power transistor configured as a vertical or lateral power device. As a specific example, an active die corresponding to active die 210 may include a III-Nitride or other group III-V based heterostructure FET (HFET), such as a high electron mobility transistor (HEMT).

As used herein, the phrase "group III-V" refers to a compound semiconductor including at least one group III element and at least one group V element By way of example, a group III-V semiconductor may take the form of a III-Nitride semiconductor that includes nitrogen and at least one group III element. For instance, a III-Nitride power FET may be fabricated using gallium nitride (GaN), in which the group III element or elements include some or a substantial amount of gallium, but may also include other group III elements in addition to gallium.

Referring once again to FIGS. 2A-2C, first metal layer 220, which may be a blanket metal layer in FIG. 2A, such as an Al, Al—Si, or Al—Si—Cu blanket layer, for example, is patterned to produce contact pads 234, as well as gate pad 236 and gate buses 238. Thus, according to the present exemplary implementation, contact pads 234 form a portion of a source contact, while gate buses 238 form a portion of a gate contact for the vertical power FET provided by active die 210.

Moving now to FIG. 2D, with continued reference to flowchart 100, in FIG. 1, flowchart 100 continues with forming dielectric layer 250 over contact pads 234 (action 103). As shown by structure 203, dielectric layer 250 may be formed as a blanket layer covering gate buses 238, as well as contact pads 234. Dielectric layer 250 may be any interlayer dielectric suitable for use in semiconductor fabrication. For example, dielectric layer 250 may be a $SiO_2$, $Si_3N_4$, or spin-on glass layer. Moreover, in some implementations, dielectric layer 250 may be a multilayer dielectric stack including more than one dielectric material.

Figure 2E:
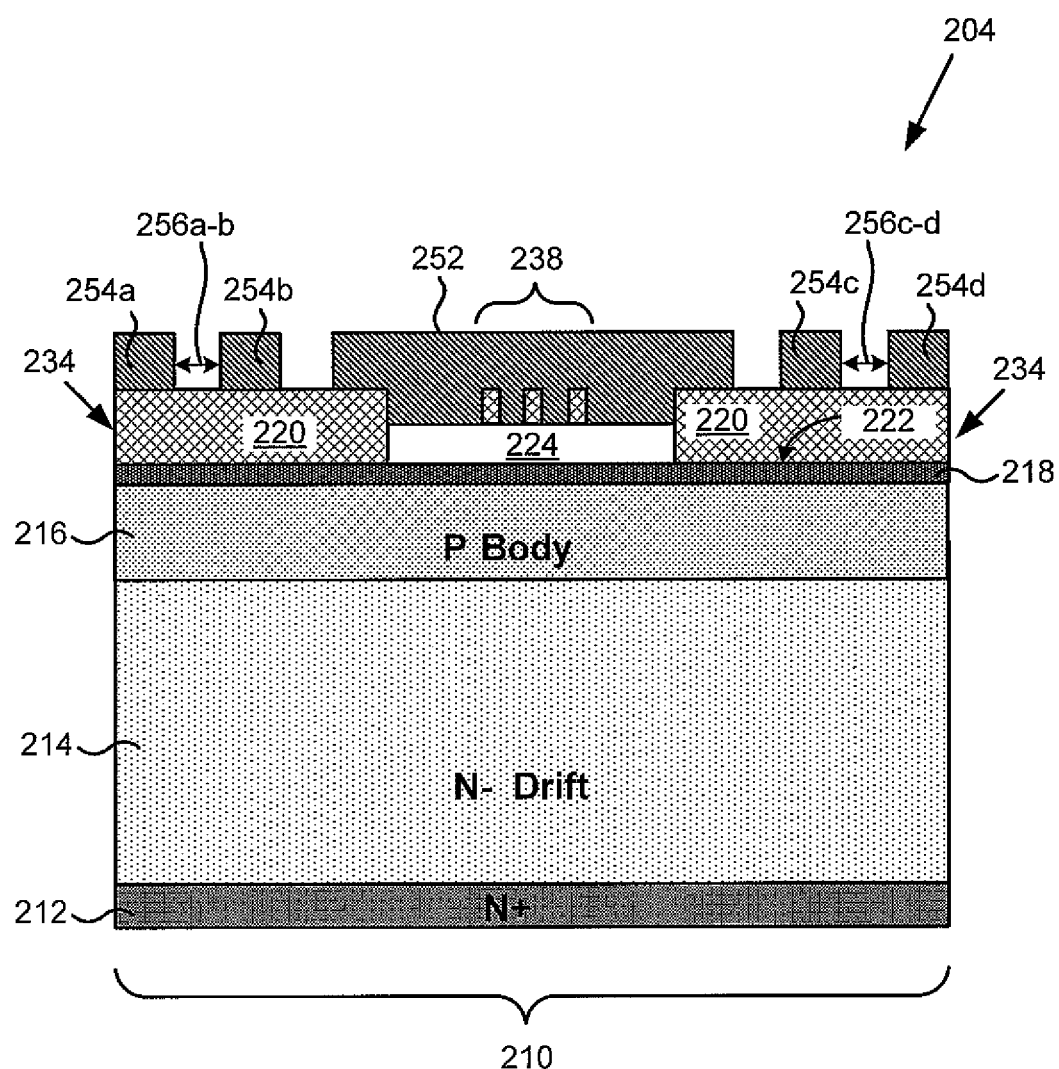
FIG. 2E shows a cross-sectional view illustrating a result of performing a subsequent action according to the exemplary flowchart of FIG. 1, according to one implementation.
Figure 2F:
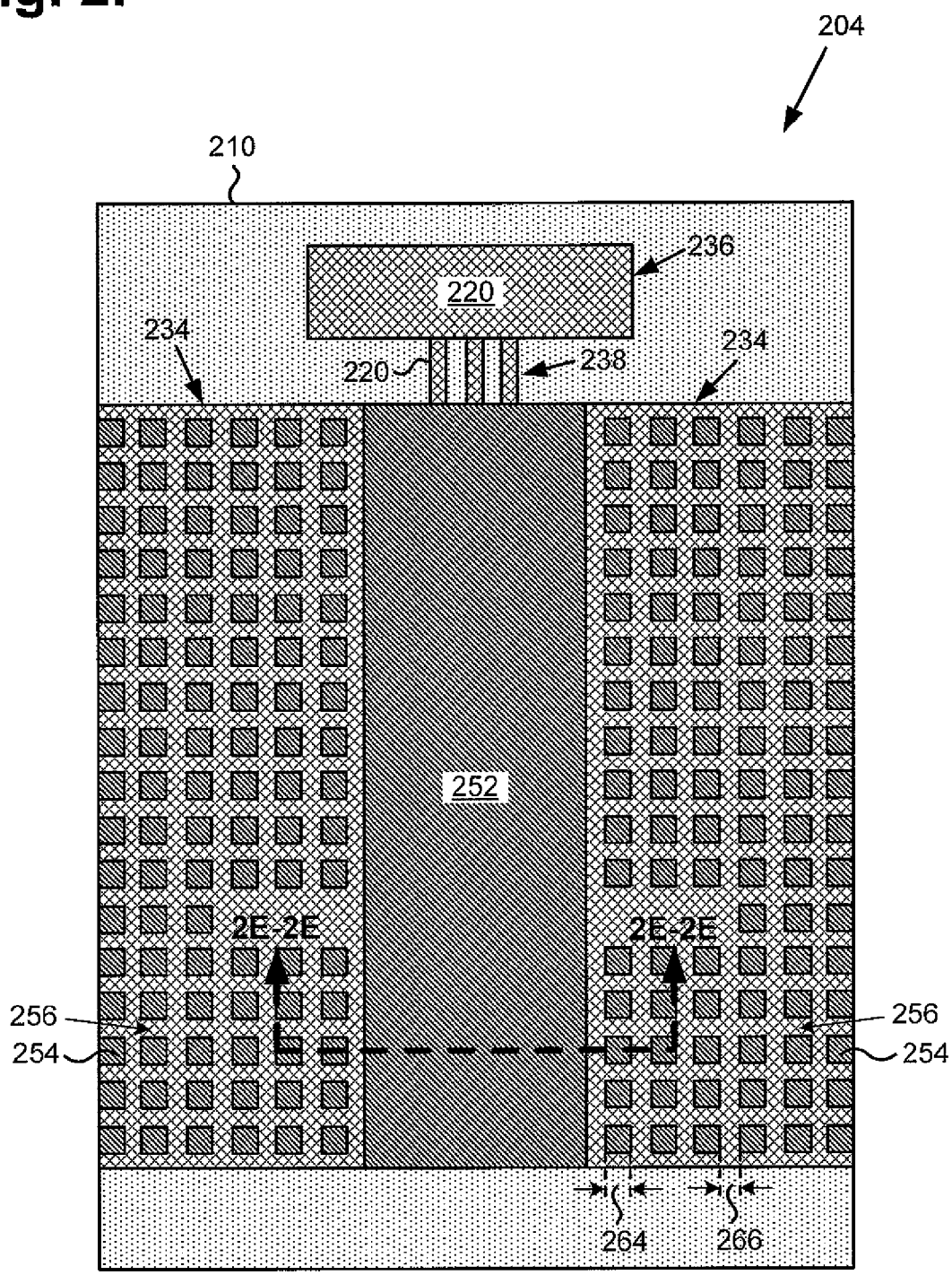
FIG. 2F shows a top view of the structure shown in cross-section in FIG. 2E, according to one implementation.

Referring to FIGS. 2E and 2F, flowchart 100 continues with patterning dielectric layer 250 to form dielectric islands 254, e.g., dielectric islands 254a, 254b, 254c, and 254d, spaced apart from one another on contact pads 234 by voids 256, e.g., voids 256a-b and 256c-d (action 104). FIG. 2E shows a cross-sectional view of structure 204 including dielectric islands 254a, 254b, 254c, and 254d, and voids 256a-b and 256c-d, while FIG. 2F shows a top view of structure 204, as well as perspective lines 2E-2E corresponding to the cross-section shown in FIG. 2E.

In addition to dielectric islands 254, patterning of dielectric layer 250 also results in substantially contiguous dielectric plate 252 being formed over and surrounding gate buses 238. As shown in FIGS. 2E and 2F, dielectric plate 252 formed over and surrounding gate buses 238 is spaced apart from, i.e., is not contiguous with, dielectric islands 254.

As further shown in FIG. 2F, each of dielectric islands 254 has width 264 and is spaced apart from each adjacent dielectric island by respective voids 256 each having width 266. Thus, referring to FIG. 2E, dielectric island 254a has width 264 and is spaced apart from dielectric island 254b by void 256a-b having width 266, dielectric island 254c has width 264 and is spaced apart from dielectric island 254d by void 256c-d having width 266, and so forth. Width 264 of dielectric islands 254 may be approximately 2.0 µm to approximately 3.0 µm, for example, while width 266 of voids 256 may be in a range from approximately 0.5 µm to approximately 10.0 µm.

As discussed above, dielectric layer 250 from which dielectric islands 254 are patterned may be a single layer of a substantially uniform dielectric material, such as $SiO_2$, or may be implemented as a multi-layer dielectric stack. Consequently, each of dielectric islands 254 may be formed of a single dielectric material, e.g., $SiO_2$, or may be formed as a dielectric stack including at least two sublayers formed of different dielectric materials. It is noted that although the exemplary implementation shown by FIGS. 2E and 2F depict dielectric islands 254 as substantially square tiles when viewed from above, in other implementations, dielectric islands 254 can have substantially any desired shape.

Figure 2G:
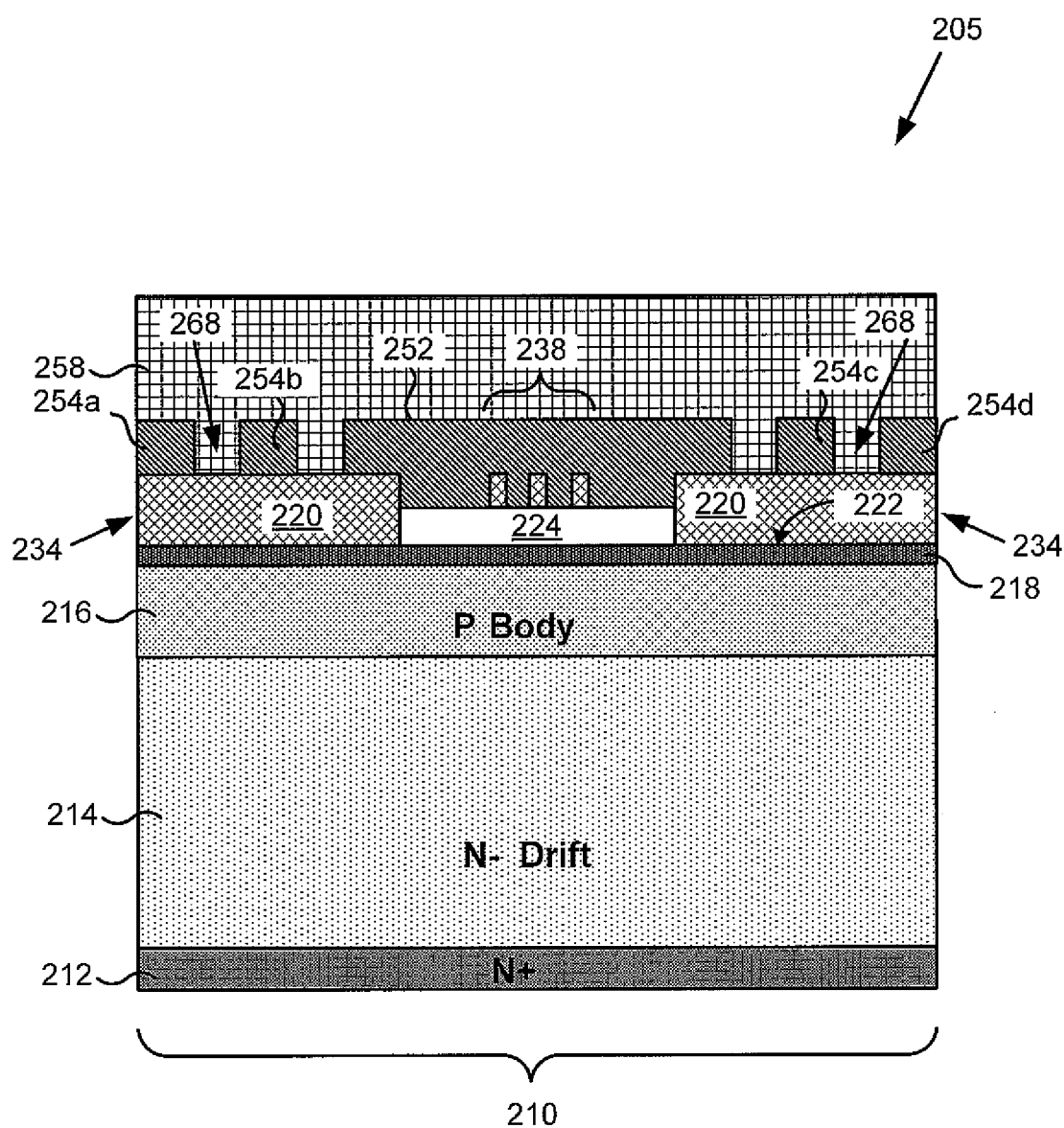
FIG. 2G shows a cross-sectional view illustrating a result of performing a subsequent action according to the exemplary flowchart of FIG. 1, according to one implementation.

Moving to FIG. 2G, flowchart 100 continues with forming second metal layer 258 between and over dielectric islands 254, second metal layer 258 substantially filling voids 256 spacing dielectric islands 254 apart (action 105). As shown by structure 205 in FIG. 2G, segments 268 of second metal layer 258 space dielectric islands 254 apart and enable second metal layer 258 to make electrical contact with contact pads 234. As further shown by FIG. 2G, second metal layer 258 is also formed over gate buses 238, but is electrically isolated from gate buses 238 by dielectric plate 252.

In some implementations, it may be advantageous or desirable for second metal layer 258 to be formed of the same metal as first metal layer 220. In those implementations, second metal layer 258 and first metal layer 220 may be formed of Al, or the same aluminum alloy, such as Al—Si or Al—Si—Cu, for example. However, in other implementations, it may be advantageoud or desirable to form second metal layer 258 from a different metal than that used to form first metal layer 220. In some implementation, for example, second metal layer 258 may be a copper (Cu) layer, such as a deposited or electroplated Cu layer, for example. Moreover, in implementation in which an active die corresponding to active die 210 provides an IC, rather than a power FET, second metal layer 258 may be a tungsten (W) layer.

It is noted that in some implementations, second metal layer 258 may be formed to a substantially greater thickness than first metal layer 220. For example, while, as noted above, first metal layer 220 may be from approximately 1.0 µm to approximately 2.0 µm thick, second metal layer 258 may have an exemplary thickness in a range from approximately 5.0 µm to approximately 10.0 µm.

Figure 2H:
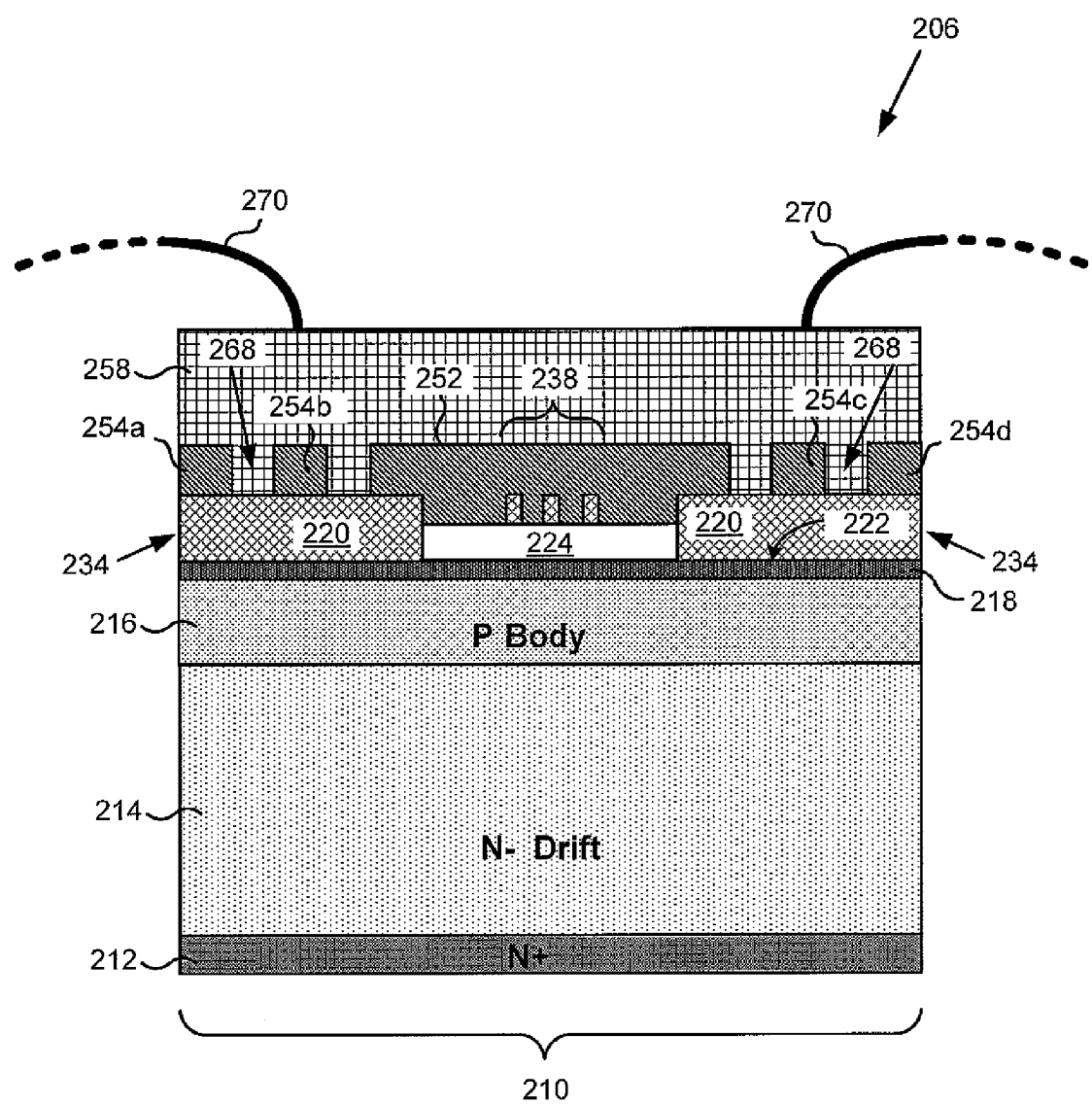
FIG. 2H shows a cross-sectional view illustrating a result of performing a final action according to the exemplary flowchart of FIG. 1, according to one implementation.

Continuing to FIG. 2H, flowchart 100 can conclude with attaching one or more electrical connectors 270 to second metal layer 258, over dielectric islands 254 (action 106). As shown by structure 206, electrical connectors 270 are depicted as wire bond for exemplary purposes. However, more generally, electrical connectors 270 can correspond to any of a conductive clip, ribbon, or strip, as well as to the wire bond shown in FIG. 2H.

Stresses due to attachment of electrical connectors 270 to second metal layer 258, over dielectric islands 254, can cause one or more of dielectric islands 254 to crack. However, in contrast to conventional structures in which a contiguous intermetal dielectric layer is formed over contact pads 234 and gate buses 238, according to the implementations disclosed in the present application, dielectric islands 254 are spaced apart from dielectric plate 252 formed over and surrounding gate buses 238. As a result, cracks formed in one or more of dielectric islands 254 due to attachment of electrical connector 270 are prevented from propagating to dielectric plate 252, thereby preserving electrical isolation of gate buses 238 from contact pad 234 and second metal layer 258. Consequently, contact pad(s) 234, dielectric islands 254, and second metal layer 258 provide a reliable and robust electrical contact for active die 210.

According to the exemplary implementation shown in FIGS. 2A-2H, active die 210 provides a group IV power FET, and electrical connectors 270 are coupled to highly doped P type body diffusion 218 and highly doped N type source regions 244 by contact pads 234 and second metal layer 258 formed between and over dielectric islands 254. Thus, in the exemplary implementation shown in FIGS. 2A-2H, contact pad(s) 234, dielectric islands 254, and second metal layer 258 provide a reliable and robust source contact for the group IV power FET of active die 210. However, one of ordinary skill in the art will recognize that contact pad(s) 234, dielectric islands 254, and second metal layer 258 can be readily adapted to provide a reliable and robust drain contact for a group IV power FET as well.

As noted above, in other implementations, an active die corresponding to active die 210 can provide a group III-V HFET. In those implementations features corresponding to contact pad(s) 234, dielectric islands 254, and second metal layer 258 can provide a reliable and robust source and/or drain contact for the group III-V HFET. Moreover, in implementations in which an active die corresponding to active die 210 is utilized to provide an IC, features corresponding to contact pad(s) 234, dielectric islands 254, and second metal layer 258 can provide a reliable and robust bond pad of the IC.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A reliable and robust electrical contact comprising:
   a contact pad patterned from a first metal layer situated over a surface of an active die;
   a plurality of dielectric islands situated over and contacting said contact pad, said plurality of dielectric islands being spaced apart from one another by respective segments of a second metal layer formed between and over said plurality of dielectric islands;
   wherein said contact pad, said plurality of dielectric islands, and said second metal layer provide said reliable and robust electrical contact.

2. The reliable and robust electrical contact of claim 1, wherein said active die comprises a group IV power field-effect transistor (FET), and said robust electrical contact is one of a source contact and a drain contact of said group IV power FET.

3. The reliable and robust electrical contact of claim 1, wherein said active die comprises an integrated circuit (IC), and said robust electrical contact provides a bond pad of said IC.

4. The reliable and robust electrical contact of claim 1, therein said active die comprises a group III-V heterostructure FET (HFET), and said robust electrical contact is one of a source contact and a drain contact of said group III-V HFET.

5. The reliable and robust electrical contact of claim 1, further comprising at least one electrical connector attached to said second metal layer, over said dielectric islands, said at least one electrical connector selected from the group consisting of a clip, a ribbon, a strip, and a wire bond.

6. The reliable and robust electrical contact of claim 1, wherein at least one of said first metal layer and said second metal layer comprises aluminum.

7. The reliable and robust electrical contact of claim 1, wherein at least one of said first metal layer and said second metal layer comprises copper.

8. The reliable and robust electrical contact of claim 1, wherein said second metal layer comprises tungsten.

9. The reliable and robust electrical contact of claim 1, wherein each of said dielectric islands comprises silicon oxide.

10. The reliable and robust electrical contact of claim 1, wherein each of said dielectric islands is formed as a dielectric stack including at least two sublayers formed of different dielectric materials.

11. The reliable and robust electrical contact of claim 1, wherein said contact pad is in direct contact with said surface of said active die.

12. The reliable and robust electrical contact of claim 1, further comprising:
   an additional contact pad patterned from said first metal layer and spaced apart from said contact pad by a dielectric segment; and
   an additional plurality of dielectric islands situated over said additional contact pad, said additional plurality of dielectric islands being spaced apart from one another by respective segments of said second metal layer.

13. The reliable and robust electrical contact of claim 12, further comprising a plurality of gate buses patterned from said first metal layer and situated over said dielectric segment; wherein said gate buses are spaced apart from one another and from said contact pad and said additional contact pad.

14. The reliable and robust electrical contact of claim 13, further comprising a dielectric plate formed over and surrounding said plurality of gate buses.

15. The reliable and robust electrical contact of claim 14, wherein said dielectric plate is spaced apart from said plurality of dielectric islands and said additional plurality of dielectric islands.

16. The reliable and robust electrical contact of claim 14, wherein said second metal layer is situated over said plurality of gate buses and electrically isolated from said plurality of gate buses by said dielectric plate.

17. The reliable and robust electrical contact of claim 11, wherein said contact pad and said additional contact pad are in direct contact with a same semiconductor device region of said active die.

18. The reliable and robust electrical contact of claim 17, wherein said semiconductor device region in direct contact with said contact pad and said additional contact pad is a highly doped P type body diffusion region overlying a P type body region of said active die.

19. The reliable and robust electrical contact of claim 1, wherein said contact pad is in direct contact with a highly doped P type body diffusion region overlying a P type body region of said active die.

20. The reliable and robust electrical contact of claim 1, wherein said second metal layer is 2.5× to 10× thicker than said first metal layer.

* * * * *